United States Patent
Lee

(10) Patent No.: US 7,986,199 B2
(45) Date of Patent: Jul. 26, 2011

(54) BAND PASS FILTER

(75) Inventor: Pao-Nan Lee, Pingtung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 213 days.

(21) Appl. No.: 12/401,072

(22) Filed: Mar. 10, 2009

(65) Prior Publication Data
US 2009/0278626 A1  Nov. 12, 2009

(30) Foreign Application Priority Data

May 9, 2008 (TW) ............................... 97117185 A

(51) Int. Cl.
*H03H 7/01* (2006.01)
(52) U.S. Cl. ........................................ 333/185; 333/175
(58) Field of Classification Search .................. 333/175, 333/176, 185, 204
See application file for complete search history.

(56) References Cited

U.S. PATENT DOCUMENTS

| | | | |
|---|---|---|---|
| 6,617,943 B1 | 9/2003 | Fazelpour | |
| 7,592,885 B2 * | 9/2009 | Sekine et al. | 333/204 |
| 2004/0000968 A1 | 1/2004 | White et al. | |
| 2008/0100401 A1 * | 5/2008 | Cho et al. | 333/204 |
| 2009/0033439 A1 * | 2/2009 | Igarashi | 333/185 |

* cited by examiner

*Primary Examiner* — Seungsook Ham
(74) *Attorney, Agent, or Firm* — J.C. Patents

(57) ABSTRACT

A band pass filter is suitable to be formed in a multi-layered circuit substrate of a wireless communication module. The band pass filter includes an input port, a first inductor, a first capacitor, a first parasitic capacitor, a second capacitor, a second inductor, a second parasitic capacitor, a third inductor, a third parasitic capacitor and a output. The input port, first inductor, first capacitor, second capacitor, third inductor and output port are sequentially electrically connected in series. The first parasitic capacitor is induced between the first inductor, first capacitor and a ground. The second inductor is electrically connected to the first capacitor, second capacitor and ground. The second parasitic capacitor is induced between the second inductor, first capacitor, second capacitor and ground. The second parasitic capacitor is electrically connected in parallel with the second inductor. The third parasitic capacitor is induced between the third inductor, second capacitor and ground.

10 Claims, 2 Drawing Sheets

BAND PASS FILTER

CROSS-REFERENCE TO RELATED APPLICATION

This application claims the priority benefit of Taiwan application serial no. 97117185, filed on May 9, 2008. The entirety of the above-mentioned patent application is hereby incorporated by reference herein and made a part of specification.

BACKGROUND OF THE INVENTION

1. Field of the Invention

The present invention generally relates to a band pass filter, and particularly to a band pass filter that can be formed in a multi-layered circuit substrate.

2. Description of Related Art

With development in technology, wireless communication systems, such as, cordless phones, cell phones, Bluetooth, wireless local area networks (WLAN), are being increasingly popularized. Most of such wireless communication systems employ a band pass filter to reduce noise while passing desired signals. In some existing systems, the band pass filter is typically disposed in a multi-layered low temperature co-fired ceramic (LTCC) substrate. However, this requires a high cost for fabricating the LTCC substrate. In addition, the band pass filter disposed in the LTCC substrate needs to be separately mounted to the circuit substrate by a surface mount technology (SMT) and occupies a certain surface area of the circuit substrate.

SUMMARY OF THE INVENTION

The present invention is directed to a band pass filter that can be formed in a multi-layered circuit substrate with relatively low cost.

The present invention is also directed to a band pass filter with a reduced layout space.

In one aspect, the present invention provides a band pass filter suitable for being formed in a multi-layered circuit substrate of a wireless communication module. The band pass filter includes an input port, a first inductor, a first capacitor, a first parasitic capacitor, a second capacitor, a second inductor, a second parasitic capacitor, a third inductor, a third parasitic capacitor, and an output port.

A first end of the first inductor electrically is connected to the input port. A first end of the first capacitor is electrically connected to a second end of the first inductor. The first parasitic capacitor is induced between the first inductor, the first capacitor and a ground. A first end of the second capacitor is electrically connected to a second end of the first capacitor. A first end of the second inductor is electrically connected to the second end of the first capacitor and the first end of the second capacitor. A second end of the second inductor is electrically connected to the ground.

The second parasitic capacitor is induced between the second inductor, the first capacitor, the second capacitor and the ground. The second parasitic capacitor is connected in parallel with the second inductor. A first end of the third inductor is electrically connected to a second end of the second capacitor. The third parasitic capacitor is induced between the third inductor, the second capacitor and the ground. The output port is electrically connected to a second end of the third inductor.

In another aspect, the present invention provides a band pass filter suitable for being formed in a multi-layered circuit substrate of a wireless communication module. The band pass filter comprises a plurality of patterned conducting layers sequentially and spacingly arranged in a stack. The patterned conducting layers include a first patterned conducting layer, a second patterned conducting layer, a third patterned conducting layer, a fourth patterned conducting layer, a fifth patterned conducting layer, and a sixth patterned conducting layer.

The first patterned conducting layer comprises an input port. The second patterned conducting layer comprises a first plane coil, a first inner electrode, and a first ground plane. The first ground plane has a first opening. The first plane coil is positioned within the first opening and electrically connected in series between the input port and the first inner electrode. The first inner electrode is positioned within the first opening and electrically connected to the first plane coil. The third patterned conducting layer comprises a second inner electrode. The second inner electrode is positioned above the first inner electrode to form a first capacitor.

The fourth patterned conducting layer comprises a second plane coil, a third inner electrode, and a second ground plane. The second ground plane has a second opening. The third inner electrode is positioned within the second opening and electrically connected to the second inner electrode. The second plane coil is positioned within the second opening and electrically connected to the third inner electrode.

The fifth patterned conducting layer comprises a third plane coil, a fourth inner electrode, and a third ground plane. The third ground plane is electrically connected to the second plane coil and has a third opening positioned above the second opening. The fourth inner electrode is positioned within the third opening and above the third inner electrode to form a second capacitor. The third plane coil is positioned within the third opening and electrically connected to the fourth inner electrode. The sixth patterned conducting layer comprises an output port. The output port is electrically connected to the third plane coil.

According to one embodiment of the present invention, the band pass filter further comprises a conducting via disposed between the third patterned conducting layer and the fourth patterned conducting layer to connect the second inner electrode to the third inner electrode.

According to one embodiment of the present invention, the band pass filter further comprises a conducting via disposed between the first plane coil and the input port to electrically connect the first plane coil to the input port.

According to one embodiment of the present invention, the band pass filter further comprises a conducting via disposed between the third ground plane and the second plane coil to electrically connect the third ground plane to the second plane coil.

According to one embodiment of the present invention, the band pass filter further comprises a conducting via disposed between the output port and the third plane coil to electrically connect the output port to the third plane coil.

According to one embodiment of the present invention, the third patterned conducting layer further comprises a fourth ground plane having a fourth opening positioned above the first opening, and the second inner electrode is positioned within the fourth opening.

According to one embodiment of the present invention, the first patterned conducting layer further comprises a fifth ground plane having a fifth opening and a sixth opening, and the input port is positioned within the fifth opening.

According to one embodiment of the present invention, the sixth opening is positioned below the first inner electrode.

According to one embodiment of the present invention, the sixth patterned conducting layer further comprises a sixth ground plane having a seventh opening and an eighth opening, and the output port is positioned within the seventh opening.

According to one embodiment of the present invention, the eighth opening is positioned above the fourth inner electrode. In the present invention, the capacitor to ground and parallel capacitor in the band pass filter prototype circuit are implemented by the parasitic capacitance. This not only can save space, but also can avoid generation of capacitor with a small capacitive value as in the prior arts. The present invention can form the band pass filter in the multi-layered circuit substrate and, therefore, the fabrication cost of the band pass filter of the present invention is lower when compared to the conventional band pass filter.

In order to make the aforementioned and other features and advantages of the present invention more comprehensible, embodiments accompanied with figures are described in detail below.

DESCRIPTION OF THE EMBODIMENTS

Figure 1:
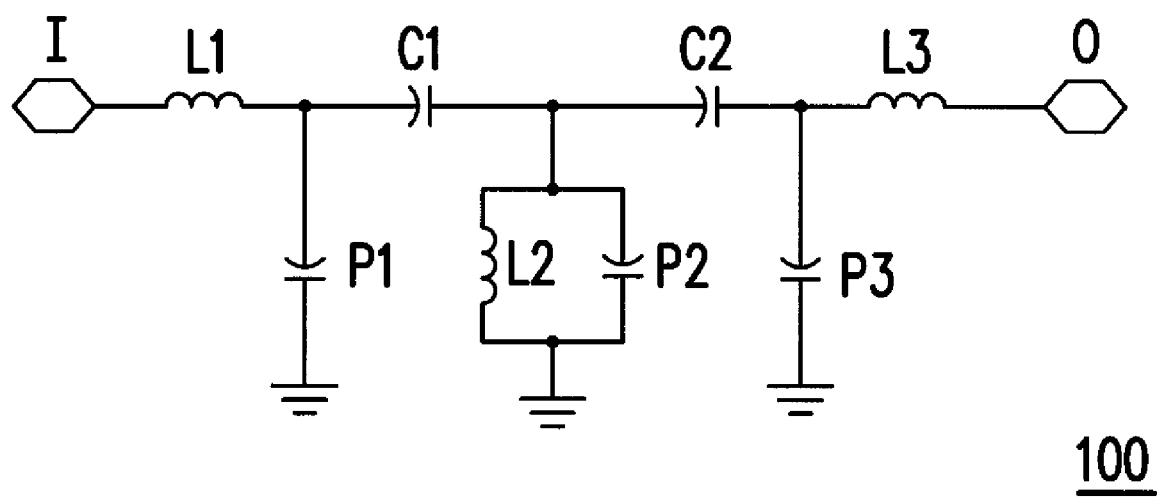
FIG. 1 is a circuit diagram of a band pass filter according to one embodiment of the present invention.

FIG. 1 is a circuit diagram of a band pass filter according to one embodiment of the present invention. Referring to FIG. 1, the band pass filter 100 of the present invention is suitable for being formed in a multi-layered circuit substrate of a wireless communication module. The band pass filter 100 includes an input port I, a first inductor L1, a first capacitor C1, a first parasitic capacitor P1, a second capacitor C2, a second inductor L2, a second parasitic capacitor P2, a third inductor L3, a third parasitic capacitor P3, and an output port O.

A first end of the first inductor L1 is electrically connected to the input port I. A first end of the first capacitor C1 is electrically connected to a second end of the first inductor L1. The first parasitic capacitor P1 is induced between the first inductor L1, the first capacitor C1, and a ground. In other words, the first parasitic capacitor P1 is a parasitic capacitance to ground of the first inductor L1 and the first capacitor C1. A first end of the second inductor L2 is electrically connected to a second end of the first capacitor C1 and a first end of the second capacitor C2, and a second end of the second inductor L2 is connected to the ground.

The second parasitic capacitor P2 is induced between the second inductor L2, the first capacitor C1, the second capacitor C2, and the ground. The second parasitic capacitor P2 is electrically connected in parallel with the second inductor L2. In other words, the second parasitic capacitor P2 is a parasitic capacitance to ground of the second inductor L2, the first capacitor C1, and the second capacitor C2.

A first end of the third inductor L3 is electrically connected to a second end of the second capacitor C2. The third parasitic capacitor P3 is induced between the third inductor L3, the second inductor C2, and the ground. In other words, the third parasitic capacitor P3 is a parasitic capacitance to ground of the third inductor L3 and the second capacitor C2. The output port O is electrically connected to a second end of the third inductor L3.

An exemplary embodiment is described below which shows the band pass filter 100 employed in a multi-layered circuit substrate.

Figure 2:
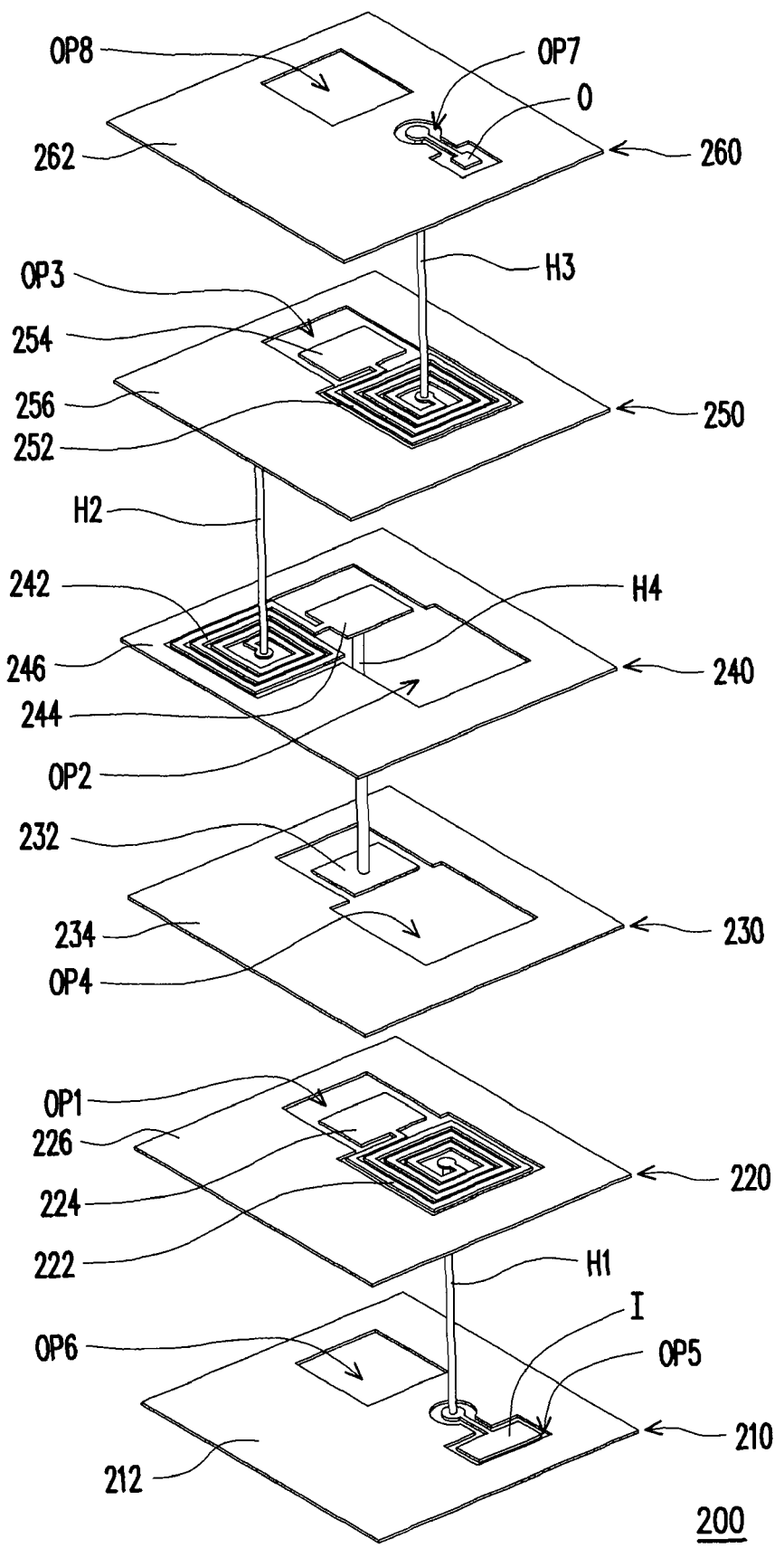
FIG. 2 is a perspective view of a band pass filter according to another embodiment of the present invention.

FIG. 2 is a perspective view of a band pass filter according to another embodiment of the present invention. Referring to FIG. 2, the band pass filter 200 includes a plurality patterned conducting layers sequentially and spacingly arranged in a stack. In the present embodiment, the band pass filter 200 is suitable for being formed in a multi-layered circuit substrate (e.g., a printed circuit board) of a wireless communication module. At least one dielectric layer (not shown) may be disposed between any two adjacent patterned conducting layers to isolate the adjacent patterned conducting layers. Material of the patterned conducting layers may be copper or other suitable materials.

These patterned conducting layers include a first patterned conducting layer 210, a second patterned conducting layer 220, a third patterned conducting layer 230, a fourth patterned conducting layer 240, a fifth patterned conducting layer 250, and a sixth patterned conducting layer 260.

The first patterned conducting layer 210 includes an input port I. In the present embodiment, the first patterned conducting layer 210 further includes a fifth ground plane 212 having a fifth opening OP5 and a sixth opening OP6. The input port I is positioned within the fifth opening OP5.

The second patterned conducting layer 220 includes a first plane coil 222, a first inner electrode 224, and a first ground plane 226. The first ground plane 226 includes a first opening OP1, and the first plane coil 222 is positioned within the first opening OP1 and connected in series between the input port I and the first inner electrode 224 The first plane coil 222 and the input port I may be electrically connected by a conducting via H1 positioned between the first plane coil 222 and the input port I. In the present embodiment, the first plane coil 222 may act as the first inductor as indicated by L1 in FIG. 1. The first plane coil 222 may be rectangular spiral, circular spiral, octagonal spiral or of another suitable form of spiral shape.

The first inner electrode 224 is positioned within the first opening OP1 and electrically connected to the first plane coil 222. In the present embodiment, the sixth opening OP6 may be positioned below the first inner electrode 224 to avoid excessive parasitic capacitance induced between the first inner electrode 224 and the fifth ground plane 212. In addition, since the first plane coil 222 and the first inner electrode 224 are both positioned within the first opening OP1, a first parasitic capacitor, as indicated by P1 in FIG. 1, is induced between the first plane coil 222, the first inner electrode 224, and the first ground plane 226. In other words, the first parasitic capacitor is the parasitic capacitance to ground of the first plane coil 222 and the first inner electrode 224.

The third patterned conducting layer 230 includes a second inner electrode 232. The second inner electrode 232 is positioned above the first inner electrode 224 and, therefore, the first electrode 224 and the second electrode 232 may constitute a first capacitor, as indicated by C1 in FIG. 1. In addition, in the present embodiment, the third patterned conducting layer 230 further includes a fourth ground plane 234. The fourth ground plane 234 has a fourth opening OP4 positioned above the first opening OP1, and the second inner electrode 232 is positioned within the fourth opening OP4.

The fourth patterned conducting layer 240 includes a second plane coil 242, a third inner electrode 244, and a second ground plane 246. The second ground plane 246 has a second opening OP2, and the third inner electrode 244 is positioned within the second opening OP2 and electrically connected to the second inner electrode 232. The second plane coil 242 is positioned within the second opening OP2 and electrically connected to the third inner electrode 244. In the present embodiment, the second plane coil 242 may act as a second inductor, as indicated by L2 in FIG. 1.

In addition, in the present embodiment, the second plane coil 242 and the third inner electrode 244 are both positioned within the second opening OP2 and, therefore, a second parasitic capacitor, as indicated by P2 in FIG. 1, is induced between the second plane coil 242, the third inner electrode 232, and the ground plane 246. In other words, the second parasitic capacitor is a parasitic capacitance to ground of the second plane coil 242, the second inner electrode 232, and the third inner electrode 244.

In the present embodiment, the band pass filter 200 further includes a conducting via H4 disposed between the third patterned conducting layer 230 and the fourth patterned conducting layer 240. The conducting via H4 electrically connects the second inner electrode 232 to the third inner electrode 244. In other words, the third inner electrode 244 may be electrically connected to the second inner electrode 232 by the conducting via H4.

The fifth patterned conducting layer 250 includes a third plane coil 252, a fourth inner electrode 254, and a third ground plane 256. The third ground plane 256 is electrically connected to the second plane coil 242 and has a third opening OP3 positioned above the second opening OP2. The third plane coil 252 may act as a third inductor, as indicated by L3 in FIG. 1. In the present embodiment, the third ground plane 256 and the second plane coil 242 may be electrically connected by a conducting via H2 disposed therebetween.

The fourth inner electrode 254 is positioned within the third opening OP3 and above the third inner electrode 244. The third inner electrode 244 and the fourth inner electrode 254 may constitute a second capacitor, as indicated by C2 in FIG. 1. The third plane coil 252 is positioned within the third opening OP3 and is electrically connected to the fourth inner electrode 254.

In the present embodiment, the third plane coil 252 and the fourth inner electrode 254 are both positioned within the third opening OP3 and, therefore, a third parasitic capacitor, as indicated by P3 in FIG. 1, is induced between the third plane coil 252, the fourth inner electrode 254, and the third ground plane 256. In other words, the third parasitic capacitor is a parasitic capacitance to ground of the third plane coil 252 and the fourth inner electrode 254.

In addition, in the present embodiment, a part of the second opening OP2 and the fourth opening OP4 is positioned between the third plane coil 252 and the first plane coil 222 to increase the quality factor (Q) and reduce loss.

The sixth patterned conducting layer 260 includes an output port O electrically connected to the third plane coil 252. In the present embodiment, the output port O may be electrically connected to the third plane coil 252 by a conducting via H3 disposed between the output port O and the third plane coil 252. In addition, the sixth patterned conducting layer 260 further includes a sixth ground plane 262 having a seventh opening OP7 and an eighth opening OP8. The output port O is positioned within the seventh opening OP7. The eighth opening OP8 is positioned above the fourth inner electrode 254 to avoid excessive parasitic capacitance induced between the fourth inner electrode 254 and the sixth ground plane 262.

In summary, in the present invention, the capacitor to ground and parallel capacitors in the band pass filter prototype circuit are implemented by the parasitic capacitance. This not only can save space, but also can avoid the problem of generation of capacitor with a small capacitive value as in the prior arts.

Furthermore, different from the conventional band pass filter that is separately fabricated and then mounted to the circuit substrate, the present invention can form the band pass filter in the multi-layered circuit substrate during fabrication of the circuit substrate. Therefore, the fabrication cost of the band pass filter of the present invention is lower when compared to the conventional band pass filter. Besides, different from the conventional band pass filter that must be mounted to the surface of the circuit substrate, the band pass filter of the present invention is directly formed in the circuit substrate and therefore occupies no surface area of the circuit substrate.

Moreover, all elements (e.g., capacitors and inductors) of the band pass filter of the present invention are formed by the common circuit substrate fabrication process. Thus, the various elements may be designed with much flexibility (e.g., the capacitance, inductance, and the shape of the inductor coil). Further, the first, second and third parasitic capacitors of the band pass filter of the present invention are formed by a specific circuit layout and need no extra design. Thus, the fabrication of the band pass filter of the present invention is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A band pass filter suitable for being formed in a multi-layered circuit substrate of a wireless communication module, the band pass filter comprising a plurality of patterned conducting layers sequentially and spacingly arranged in a stack, the patterned conducting layers comprising:

a first patterned conducting layer comprising an input port;

a second patterned conducting layer comprising a first plane coil, a first inner electrode, and a first ground plane, the first ground plane having a first opening, the first plane coil being positioned within the first opening and electrically connected in series between the input port and the first inner electrode;

a third patterned conducting layer comprising a second inner electrode, the second inner electrode being positioned above the first inner electrode to form a first capacitor;

a fourth patterned conducting layer comprising a second plane coil, a third inner electrode, and a second ground plane, the second ground plane having a second opening, the third inner electrode being positioned within the second opening and electrically connected to the second inner electrode, the second plane coil being positioned within the second opening and electrically connected to the third inner electrode;

a fifth patterned conducting layer comprising a third plane coil, a fourth inner electrode, and a third ground plane, the third ground plane being electrically connected to the second plane coil and having a third opening positioned above the second opening, the fourth inner electrode being positioned within the third opening and above the third inner electrode to form a second capacitor, the third plane coil being positioned within the third opening and electrically connected to the fourth inner electrode; and a sixth patterned conducting layer comprising an output port, the output port being electrically connected to the third plane coil.

2. The band pass filter according to claim 1, further comprising a conducting via disposed between the third patterned conducting layer and the fourth patterned conducting layer to connect the second inner electrode to the third inner electrode.

3. The band pass filter according to claim 1, further comprising a conducting via disposed between the first plane coil and the input port to electrically connect the first plane coil to the input port.

4. The band pass filter according to claim 1, further comprising a conducting via disposed between the third ground plane and the second plane coil to electrically connect the third ground plane to the second plane coil.

5. The band pass filter according to claim 1, further comprising a conducting via disposed between the output port and the third plane coil to electrically connect the output port to the third plane coil.

6. The band pass filter according to claim 1, wherein the third patterned conducting layer further comprises a fourth ground plane having a fourth opening positioned above the first opening, and the second inner electrode is positioned within the fourth opening.

7. The band pass filter according to claim 1, wherein the first patterned conducting layer further comprises a fifth ground plane having a fifth opening and a sixth opening, and the input port is positioned within the fifth opening.

8. The band pass filter according to claim 7, wherein the sixth opening is positioned below the first inner electrode.

9. The band pass filter according to claim 1, wherein the sixth patterned conducting layer further comprises a sixth ground plane having a seventh opening and an eighth opening, and the output port is positioned within the seventh opening.

10. The band pass filter according to claim 9, wherein the eighth opening is positioned above the fourth inner electrode.

* * * * *